Jan. 27, 1953 P. R. BELL, JR 2,627,024
AUTOMATIC FREQUENCY CONTROL
Filed April 21, 1944
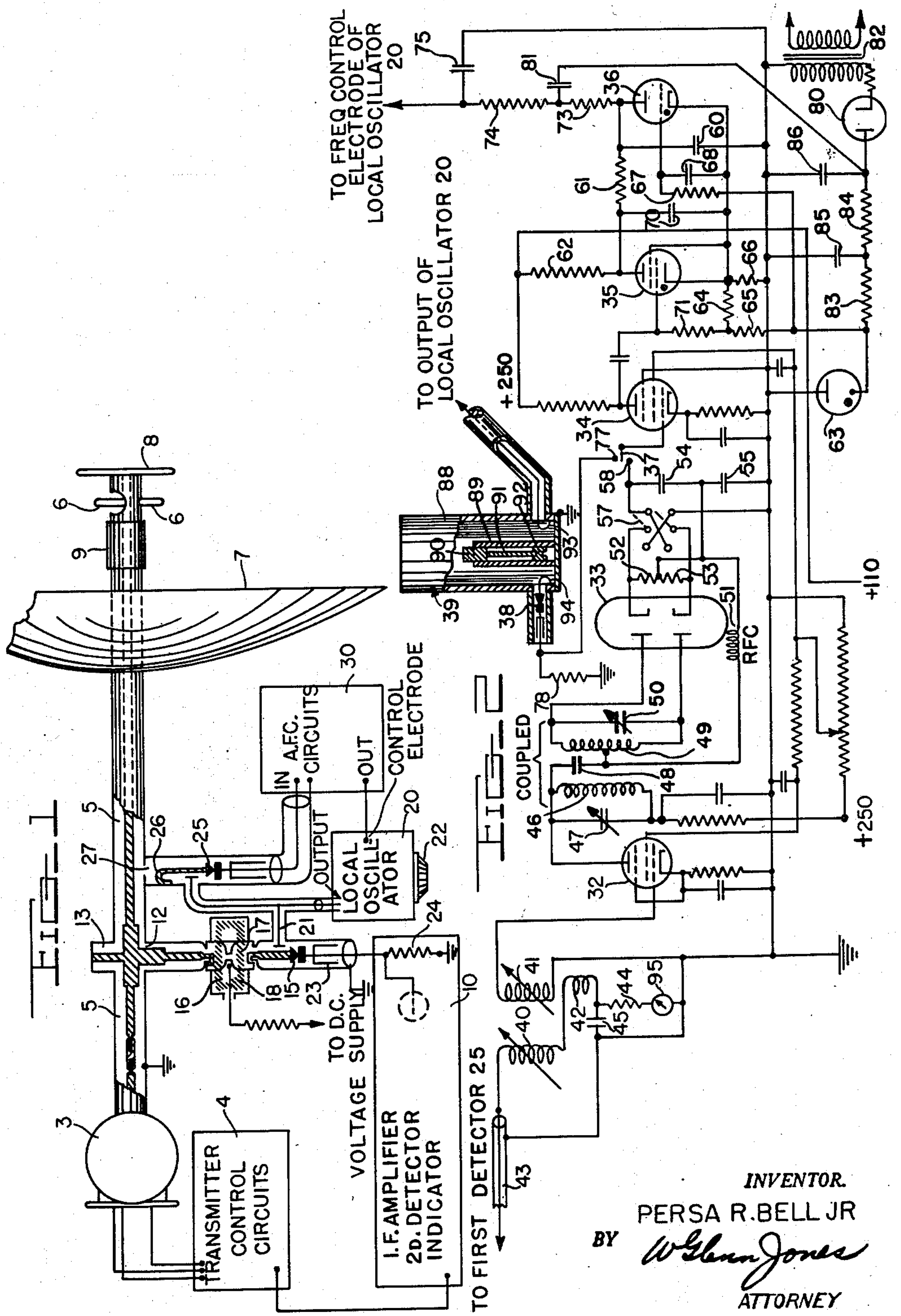
INVENTOR.
PERSA R. BELL JR
BY W. Glenn Jones
ATTORNEY Patented Jan. 27, 1953

2,627,024

UNITED STATES PATENT OFFICE 2,627,024

AUTOMATIC FREQUENCY CONTROL

Persa R. Bell, Jr., Cambridge, Mass., assignor, by mesne assignments, to the United States of America as represented by the Secretary of the Navy Application April 21, 1944, Serial No. 532,154

12 Claims. (Cl. 250—20)

This invention relates to improvements in automatic tuning of high frequency radio equipment and particularly to automatic frequency control arrangements especially adapted for the control of receivers used in radio-echo detection and location systems. The invention includes means for automatically tuning the receiver of such a system to the frequency of a transmitter associated therewith and also means for tuning the receiver of such a system at a predetermined "spot" frequency for purposes hereinafter explained.

Automatic tuning circuits for automatically maintaining receiver tuning upon a received signal have been known for some years. A special type of automatic tuning control circuit adapted to serve this purpose in connection with radio-echo detection systems operating by means of short pulses of radiated energy has recently been worked out which has the desirable characteristic that the receiver tuning is automatically varied over a substantial range when no signal is being received and when a signal is found the receiver then is automatically tuned to such signal. The automatic tuning of the receiver to the received signal, however, has the disadvantage that the tuning may "lock" upon an interfering signal from extraneous source, so that the radio-echo detection and location system would then become inoperative. Moreover, the protective discharge devices commonly associated with receivers in pulse-transmitting systems tend to distort the frequency spectrum of the transmitter pulses in a manner that makes it difficult to use signals so distorted to control receiver tuning. It is desirable to operate frequency control upon the transmitter pulse (i. e. a signal received at the time of transmitter operation) in order to avoid interference from outside sources. In the apparatus herein described, therefore, the receiver tuning is controlled by automatic tuning circuits which are actuated by locally transmitted radio energy and are substantially unaffected by any received signals whatever. Likewise, for the purpose of obtaining signal indications from outside stations, such as beacon transmitters at fixed locations adapted for use in connection with the radio-echo detection equipment of mobile craft, as described in the application of L. W. Alvarez, Serial No. 479,625, which matured into U. S. Patent 2,568,265 on September 18, 1951, receiver tuning is operated by automatic frequency control circuits which cooperate with a resonator adapted to serve as a frequency standard which may be adjusted before the equipment is put into service so that its use will result in the receiver being tuned to the frequency of the desired external station.

One object of the present invention is to provide automatic tuning control for a radio system including a transmitter and a receiver intended to operate upon the same frequency which control is adapted to tune the receiver to the frequency of the transmitter without subjecting the tuning control to disturbance by interfering signals from other sources. Another object of the invention is to provide a reliable and convenient method for tuning the receiver of a radio-echo detection and location system to a predetermined frequency.

The organization of the automatic frequency control apparatus in accordance with the present invention in a radio-echo location and detection system is illustrated in the annexed drawings, in which Fig. 1 is a partially simplified diagrammatic representation of a radio-echo location and detection system provided with automatic tuning in accordance with the present invention, and Fig. 2 is a circuit diagram illustrating an automatic tuning control circuit.

Fig. 1 shows how the automatic tuning control circuits are organized with respect to other apparatus of a typical radio-echo detection and location system. The transmitting high-frequency generator of the system, which may be a magnetron type of vacuum tube, is shown at 3 and is adapted to be excited by the transmitter control circuit to generate intermittent short pulses of high-intensity radio-frequency electric energy which are transmitted to and along the transmission line 5 to a dipole antenna 6. The dipole antenna 6 is associated with a parabolic reflector 7 and an auxiliary disk reflector 8 in order to provide an antenna system having highly directive characteristics. A resonator 9 located near the dipole 6 is used to balance electrically the excitation of the dipole 6 by the transmission line 5. The antenna system is usually provided with means, not shown, for orienting and aiming it in a desired direction or for causing it to be aimed successively in different directions in accordance with a predetermined scanning motion. Such means for controlling the orientation of the antenna system are usually connected by suitable control arrangements with the indicator circuit of the receiver 10 in order to correlate the orientation information with such information as may be obtained from reecived echoes of the transmitted signal.

In order that the antenna system may be oriented in various directions it is usual to provide in the transmission line 5 certain joints adapted to permit rotation while maintaining the desired transmission characteristics. These and other minor featuers of commonly used radio-echo detection systems are not shown on Fig. 1 in order to simplify the representation. Indeed the rotating joints need not be employed in the system, for the transmitter and the entire transmission line 5 may be physically mounted as a unit supported on the steerable or rotatable support of the antenna system, the transmitter being in such case mounted almost immediately in back of the parabolic reflector 7. Such an arrangement has the advantage that the transmission line 5 is extremely short, thus reducing losses, and, to some extent, reducing the frequency-sensitivity of the system. In such case, good engineering practice will readily indicate which components of the system are most conveniently and desirably mounted with the transmitter to be moved with the antenna system and which components of the system are more conveniently mounted so as to be independent of the orientation of the antenna system and connected by suitable slip-ring contacts or the like with the components mounted together with the antenna system. Suitable counterbalancing of the movable components of such a system can readily be devised in accordance with known engineering principles.

The antenna system 6, 7, 8 is adapted to be used for receiving echoes of transmitted pulses and other signals, if desired, as well as for radiating transmitted pulses. For this purpose a junction 12 is provided for connecting receiving apparatus to the transmission line 5. At the junction 12 it is convenient to support the inner conductor of the transmission line 5 by means of a resonant stub support 13. It will be noted that a similar stub support is provided forwardly of the dipole 6. In a system in which the transmitter is mounted directly back of the reflector 7, no further rigid supports of the inner conductor of the transmission line 5 are necessary.

Certain portions of the inner conductor of the transmission line 5 in the neighborhood of the junction 12 are thickened for the purpose of reducing frequency-sensitivity of the systems, in accordance with the principles described in the application of R. V. Pound, Serial No. 475,149 which matured into U. S. Patent 2,446,982 on August 10, 1948. Precautions are taken to assure that no substantial portion of the energy of a received signal is absorbed in the transmitter 3 or in the portion of the transmission line 5 associated therewith, in accordance with principles heretofore formulated and described in the application of J. L. Lawson, Serial No. 492,062, which matured into U. S. Patent 2,552,489, on May 8, 1951, or by providing apparatus of the nature of that described in the application of H. K. Farr, Serial No. 488,098.

A crystal mixer 15 is connected to the junction 12 through a protective breakdown device 16 of the type described in the application of J. L. Lawson, Serial No. 479,662. The device 16 includes input and output coupling loops and a tuned resonator the inner portion of which is maintained under partial vacuum conditions by means of a glass envelope 17. In the said central portion is an electrical discharge gap situated in a portion of the resonator adapted to provide relatively high alternating voltages at the signal frequency. An electrode 18 is preferably provided in the partially evacuated enclosure in the neighborhood of but not within the said discharge gap, for the purpose of maintaining a slight degree of ionization near the discharge gap in order to promote prompt electrical breakdown in the device 16 when the transmitter 3 is in operation. The distance between the device 16 and the junction 12 is adjusted in accordance with known principles so as to exert a minimum interference with the transmission of energy from the transmitter 3 to the antenna 6 along the transmission line 5.

During period of quiescence of the transmitter 3 there is no electrical breakdown discharge in the device 16 and because of the tuning of this device an energy transfer relationship involving very little attenuation is established between the junction 12 and the crystal mixer 15. It is desirable that the tuning of the device 16 should be sufficiently broad to permit operation of the system without readjustment in spite of slight variations normally to be expected in the frequency of operation of the transmitter 3 and, in some cases, to include within the frequencies passed by the device 16 with reasonably little attenuation, not only the frequency of operation of the transmitter 3 but also slightly different frequency at which fixed beacon stations are operated.

In order that the receiver system of the apparatus shown in Fig. 1 may have good selectivity ,the receiver operates on the super-heterodyne principle, so that the mixer 15 in addition to being furnished energy from a received signal is also furnished energy from a local oscillator 20. The local oscillator 20 is coupled to the crystal mixer 15 through a capacitative connection provided at the extremity of the central conductor of the transmission line 21 which is connected with the output of the local oscillator. The local oscillator is preferably of the type having a frequency control electrode the voltage of which is adapted to control the frequency of oscillation. Local oscillators having mechanical frequency control may be used in connection with the present invention, as may be well understood, provided a suitable translating mechanism is interposed betwen the frequency control device and the automatic frequency control circuit. Even if the oscillator is of the type having electrical frequency control, there will usually alos be a mechanical frequency control for extending the range of local oscillator tuning, as represented by the manual tuning knob 22. In devices intended to serve at or near predetermined frequencies, the tuning knob 22 may be replaced by a screw-driver type adjustment.

The circuit of the radio-frequency oscillations impressed upon the mixer 15 is completed by a suitable radio-frequency by-pass device which may be of the capacity type or of the resonator type, represented by the structure 23. The circuit of the detected beat frequency oscillations is completed through the input resistor 24 of the intermediate frequency amplifier portion of the receiver 10, the voltage across the resistor 24 being amplified and detected and utilized to operate an indicator in the receiver 10.

The local oscillator 20, in addition to providing radio-frequency energy to the crystal mixer 15 also provides radio-frequency energy to another crystal mixer 25 which likewise operates upon the super-heterodyne principle. The crystal mixer 25 is fed by a loop 26 which is adapted to pick up a very small portion of the radio-frequency energy transmitted in the transmission line 5. The portion of such transmitted energy which the loop 26 is adapted to pick-up is so small that the intermediate frequency output of the crystal mixer 25 is negligible except when the transmitter 3 is in operation. The amount of energy picked up by the loop 26 when the transmitter 3 is in operation is approximately of the order of the energy reaching the mixer 15 when the transmitter 3 is in operation in spite of the attenuation introduced by the device 16 when a breakdown occurs therein. If desired the energy picked up in the loop 26 may be either more or less, but if the mixer 25 is of the silicon crystal type, it cannot, with crystals now available, be very much more because of the danger of damage to the crystal. By the use of a separate heterodyne mixer for tuning control the effect of distortion of the frequency spectrum of the transmitted pulse by the action of a protective discharge device is avoided.

Sufficiently loose coupling to provide the desired amount of energy transfer between the loop 26 and the transmission line 5 is conveniently provided by a small hole 27 of the outer conductor of the transmission line 5 and by attenuation in the tube between the hole and the loop 26. The size of the hole 27, the distance from such hole to the loop 26, and the diameter of the connecting tube in general determine the degree of coupling and the amount of energy transfer. A hole of about 1/4 inch in diameter and a distance of one inch between the loop 26 and the wall of the outer conductor of the transmission line 5 with a connecting tube diameter of 5/8 inch have been found to be suitable, producing in the apparatus in question about 70 db attenuation. The automatic tuning control circuit indicated in general on Fig. 1 by the block 30 operates in the manner described below in connection with Fig. 2. The output of the circuit 30 is a voltage adapted to produce control in the frequency of the local oscillator 20. As pointed out more particularly in Fig. 2, the circuit 30 includes not only means for controlling the frequency of the local oscillator 20 in accordance with the frequency of signals emitted by the transmitter 3, picked up by the loop 26 and passed through the mixer 25, but also means for setting the frequency of the local oscillator 20 at a value adapted to provide reception in the receiver 10 of signals of a predetermined frequency.

In the arrangement of Fig. 1, the extreme looseness of coupling between the loop 26 and the transmission line 5 effectively prevents interference with the automatic tuning of the local oscillator 20 arising from extraneous signals picked up by the antenna 6. This is of very great importance if the apparatus is to be used in the neighborhood of other apparatus operating at nearly the same frequency. However, when it is desired to receive the signal of an external station such as a beacon transmitter, control of the frequency of the local oscillator with reference to the received signal itself is avoided and instead the local oscillator is controlled with reference to a frequency standard.

The frequency control circuit, as shown in Fig. 2, includes a discriminator circuit of the Foster-Seeley type including the vacuum tubes 32 and 33, an amplifier including the vacuum tube 34, and, finally, two gas discharge tubes 35 and 36 operating in a circuit organized in accordance with principles described in the application of H. G. Weiss, Serial No. 512,926. The input to the amplifier 34 is brought through a switch 37 which is adapted to connect said input either to the output of the vacuum tube 33 or to the output of a crystal detector 38 associated with a resonator 39 which is adapted to act as a frequency standard and is connected also to the output of the local oscillator 20.

The output of the mixer 25 (see Fig. 1) is coupled to the grid circuit of the vacuum tube 32 (Fig. 2) by means of a coupling device including the variable inductances 40 and 41 and the coil 42 coupled to the inductance 41. The inductances 40 and 41 are adapted to tune the input side of the amplifier which includes the vacuum tube 32 and to provide the electrical conditions for effective energy transfer through the transmission line 43 to the amplifier 32. The coupling coil 42 is in series not only with the transmission line 43 (and hence the crystal mixer 25 and the loop 26) but also with a meter 95 which is adapted to read the rectified current produced by the action of the local oscillator 20 on the mixer 25 and a resistor 44 which is adapted to act as a filter to prevent injurious feed-back effects which might take place by way of the leads to the meter 95. The resistor 44 may conveniently have a value of about 100 ohms. The resistor 44′ is by-passed by the condenser 45 which may have a value of about .001 $\mu\mu f$. Instead of a meter 95 permanently connected in the circuit, a closed circuit jack may be provided to permit insertion of an external meter when needed. The adjustment of the inductances 40 and 41 is not independent of the length of the transmission line 43, so that if the latter is changed by a substitution of connecting cables, readjustment of the inductances 40 and 41 will be desirable. For this reason it is advisable to take care in practice to keep the length of the transmission line 43 constant, in order to avoid the necessity of additional adjustment.

The plate circuit of the vacuum tube 32 includes an inductance 46 and a condenser 47 which together constitute a circuit tuned to a frequency near the middle of the range which is amplified by the intermediate frequency amplifier of the receiver 10. This circuit in accordance with the principles of the well-known Foster-Seeley circuit heretofore referred to is connected through a condenser 48 to the midpoint of the inductance 49, which is tuned by the condenser 50 to the aforesaid frequency, and which is coupled to the inductance coil 46. The midpoint of the inductance 49 is connected through a radio-frequency choke 51 to the midpoint of a voltage divider network comprising the resistors 52 and 53, which are substantially of equal value, such as about 10,000 ohms each, and also to the common connection of a pair of series-connected condensers 54 and 55. A reversing switch 57 is interposed between the terminals of the voltage divider network, 52, 53 and the series-condenser combination 54, 55. The condenser 55, one side of which is connected to ground is preferably of about the same capacitance as condenser 48 and may have a value of about 25 $\mu\mu f$. The condenser 54, which is not grounded, preferably has about twice the value of capacitance of the condenser 55. The terminal of the condenser 54 which is not connected to the condenser 55 is connected to the terminal 58 of the switch 37 and constitutes the output terminal of the discriminator circuit associated with the vacuum tube 33. The vacuum tube 33 is a double diode the anodes of which are connected to the terminals of the condenser 50 and the cathodes of which are connected respectively to the terminals of the voltage divider network 52, 53. Alternatively two single diodes may be used connected in the same manner. In accordance with the principles of the Foster-Seeley discriminator circuit, the anode circuit of the vacuum tube 32 and the circuits associated with the vacuum tube 33 constitutes a frequency-sensitive circuit adapted to provide an output voltage which depends on frequency and which varies substantially linearly with frequency over a considerable range in the neighborhood of the frequency to which the resonant circuits are tuned. The circuit operates to produce such an output by virtue of the phase difference between coupled tuned circuits, as described in proceedings of the Institute of Radio Engineers, volume 25, page 289 (1937). The output of the discriminator circuit just described may be connected through the switch 37 to the amplifying tube 34 which in turn controls the action of the gas discharge tube 35. The Foster-Seeley discriminator circuit is one form of frequency comparing circuit and may be broadly regarded as a filter circuit associated with detector means.

Before considering the function of the gas discharge tube 35, it is convenient to consider the operation of the gas discharge tube 36. In the absence of any signals provided by the mixer 25 the gas discharge tube 36 operates, in association with condensers and resistors connected thereto as a relaxation oscillator, with the result that the voltage of the anode of the tube 36 alternately gradually rises and suddenly falls between substantially fixed values. This change of voltage is thus in the form of a saw-tooth wave the period of which may conveniently be about once per second and the amplitude of which may conveniently be about 60 or 70 volts. The period of this wave is controlled by the value of the condensers and resistors associated with the tube 36. The upper plate of the condenser 60 will normally be rising in voltage and will be prevented from rising above some set value by the firing of tube 36, which is adapted to return this voltage suddenly to a low value from which is may then rise again.

The oscillations of the vacuum tube 36 are produced substantially as follows. The condenser 60 is connected between the anode of the tube 36 and ground. The anode of the tube 36 is connected to a positive voltage having a value of about 110 volts through the high resistances 61 and 62, which may have values of about 3.3 megohms and 500,000 ohms respectively. The cathode of the tube 36 is connected to a negative voltage of substantially —150 volts, the value of which is regulated by the gas discharge type regulator tube 63, the connection of the cathode of the tube 36 to the said negative voltage being through the resistors 64 and 65 which both have values of about 2200 ohms. The resistor 66 has a relatively high value, approximately 56,000 ohms. When the gas discharge tube 36 is in a conducting condition, the anode of the tube 36 will have a potential which is considerably negative with respect to ground potential because of the values of the resistor 61, 62, 64 and 65. Since the resistors 64 and 65 have a relatively low value, the condenser 60 is negatively charged with relative rapidity through the gas discharge tube 36 while the latter is conducting. When the charging of the condenser 60 brings the potential of the anode of the gas discharge tube 36 to a value which differs from the potential of the cathode of the tube 36 only by the amount of the extinction potential of the tube, the tube will be extinguished and assume a non-conducting state. Thereafter the negative charge of the condenser 60 will be dissipated slowly through the high resistances 61 and 62. During the course of such discharge the anode potential of the tube 36 will gradually rise until it reaches a value which differs from the cathode potential of the tube 36 by the ignition potential of the tube, at which time the tube 36 will ignite and assume a conducting state, again permitting negative charging of the condenser 60 and initiating another cycle of oscillation.

The potential of the grid of the tube 36 may be adjusted to control the difference between the ignition and extinction potential of the tube 36, thus controlling the amplitude of the voltage wave produced at the anode of the tube 36. For this purpose the grid of the tube 36 may be connected to the negative voltage of approximately 150 volts regulated by the gas discharge tube 63, the said connection being accomplished through a resistor 67, which may have a value of about 100,000 ohms. The grid of the tube 36 may be by-passed to the cathode by means of the condenser 68 which may have a value of about .01 $\mu f$. It is to be understood that the tube 36 may be a diode instead of a triode, as more fully explained in the aforesaid application of H. G. Weiss, but the use of a triode is preferred because of the advantages of the control that is thereby possible of the difference between the ignition and extinction potential of the tube.

The operation of the discharge tube 36 and its associated circuits is modified by the operation of the discharge tube 35 in response to signals furnished to it by the amplifier tube 34. The cathode of the discharge tube 35 is preferably connected to and maintained at the same potential as the cathode of the discharge tube 36 (although this is not necessary, as more fully pointed out in the aforesaid application of H. G. Weiss). The anode of the gas discharge tube 35 is connected to the common terminal of the resistors 61 and 62 and a condenser 70 which preferably has a value considerably smaller than the value of the condenser 60. Thus the condenser 60 may have a value of 0.5 $\mu f$ and the condenser 70 may have a value of about .01 $\mu f$.

When no signals are being transmitted by the amplifier tube 34 to the gas discharge tube 35, the latter will be maintained in a non-conducting condition because of the bias furnished to its grid from the aforesaid source of negative voltage through the resistors 65 and 71, the resistor 71 having a relatively high value, such as about 100,000 ohms. Under such conditions the condenser 70 will tend to be positively charged.

When a signal is impressed upon the grid of the discharge tube 35 which is of sufficient voltage to cause the said discharge tube to ignite and become conducting, the anode current of the tube 35, will, in consequence of the high resistance of the resistor 62 cause the anode voltage to drop, so that the time for which the tube 35 remains conducting after having been ignited by a signal is determined by the time required for the condenser 70 to discharge through the tube to the extinction potential of the tube. After the tube 35 is extinguished and resumes the non-conducting condition, the condenser 70 is again charged through the resistor 62. When a series of signal pulses provided by the amplifier 34 has sufficient voltage to cause a series of ignition cycles of the tube 35, each discharge of the condenser 70 through the tube 35 and recharge through the resistor 62 will counteract temporarily the rise of the voltage of the upper plate of condenser 60 and of the anode of the tube 36. The characteristics of the anode circuit of the tube 35 are so chosen so that when the tube 35 is ignited upon substantially every pulse of the transmitter 3 the voltage of the anode, of the upper plate of condenser 60 will be reduced, or kept down to a quite negative value. Between the normal progressive rise of the voltage of the upper plate of condenser 60 and the operation of tube 35 a fast short-period and short-range hunting action takes place which enables the receiver to be satisfactorily tuned to a signal when the voltage of the upper plate of condenser 60 is applied to the frequency control electrode of the local oscillator of the receiver.

Now the voltage of the signal pulses furnished by the amplifier tube 34 to the gas discharge tube 35 is, by virtue of the discriminator circuit associated with the vacuum tube 33, dependent upon the frequency of the signal pulses. The frequency of the pulses furnished to the discriminator circuit is determined by the difference in frequency between the local oscillator 20 and the transmitter 3. The frequency of the local oscillator 20 is subject to control by the voltage of an electrode of the oscillator tube and this voltage is provided by connecting the upper plate of the condenser 60 to such electrodes through a filter including the resistors 73 and 74 and the condenser 75.

The reversing switch 57 may then be thrown to that one of its positions which, when the frequency of signal pulses provided to the discriminator circuit changes in a given direction, will result in operation of the discharge 35 such as to produce or permit a change of the frequency of the local oscillator 20 which is adapted to change the frequency of the signal provided to the discriminator circuit in the direction opposite to the said given direction. The proper setting of the switch 57 will depend upon the direction of the change of frequency of the local oscillator 20 resulting from a change in voltage of the frequency control electrode in a given direction and upon whether the local oscillator 20 is operating at a frequency higher or lower than the frequency of the transmitter 3. Thus, if it be assumed that the local oscillator is operating at a frequency higher than that of the transmitter 3 and if it be further assumed that a more negative voltage of the frequency control electrode corresponds to a relatively higher frequency of operation of the local oscillator 20, the oscillations produced by the discharge tube 36 in the absence of any signals igniting the discharge tube 35 will cause the local oscillator frequency alternately to decrease slowly and rise suddenly. Assuming that the range of variation of the local oscillator frequency is adapted for the reception of signals of the frequency of the transmitter 3, when the transmitter 3 is in operation pulses will be detected by the detector 25 and the intermediate frequency produced by the mixer 25 will tend to decrease gradually as the voltage of the anode of the tube 36 rises gradually. When this intermediate frequency is at the cross-over frequency of the discriminator circuit( the frequency to which the anode circuit of the tube 32 and the circuits 49, 50 are tuned), the output of the discriminator 33 will be zero, the tube 35 will be maintained non-conducting, the voltage of the upper plate of the condenser 60 will become gradually less negative and the frequency of the local oscillator and the intermediate frequency in the output of mixer 25 will still gradually decrease. As the frequency of the signal provided to the discriminator circuit decreased, the output of the discriminator circuit becomes less positive and more negative assuming that the switch 57 is thrown to the left. Eventually, decrease in frequency will result in a negative voltage being applied through the switch 37 to the grid of the tube 34. Negative pulses applied to the grid of the tube 34 will result in the application of positive pulses to the control grid of the tube 35. When the signals amplified by the tube 34 are of sufficient magnitude to cause the tube 35 to ignite, the rise of the voltage of the anode of the tube 36 will be counteracted as previously described and the local oscillator frequency will be maintained at a value adapted to keep the intermediate frequency of the signal detected by the detector 25 substantially constant.

When the switch 57 is in the wrong position, as is more fully explained in the said application of H. G. Weiss, because of the nature of the discriminator characteristic, some frequency control will take place, but the frequency of the local oscillator will in general be adjusted so that the intermediate frequency signal is at a frequency near the edge of the pass band of the intermediate-frequency amplifier of the receiver instead of at a frequency substantially at the center of said pass band. This undesirable situation results in a great reduction of the intermediate-frequency amplifier response. Thus, if it should not be known whether the local oscillator was operating on a frequency higher or lower than the frequency of the transmitter, the switch 57 could be correctly set by simply noticing which position produces the greater response in the receiver 10 (Fig. 1).

When it is desired to tune the local oscillator for the reception of signals of a predetermined fixed frequency, the switch 37 (Fig. 2) is disengaged from the contact 58 and is connected to the contact 77. The voltage provided to the amplifier tube 34 will then be proportional to the rectified current of the crystal detector 38, which current produces a voltage through the load resistor 78. The rectified current of the detector 38 depends upon the difference in frequency between the output of the local oscillator 20 and the natural frequency of the resonator 39. When this frequency difference is zero, a maximum rectified current will result. For reasons which will be explained more fully below the natural period of the resonator 39 is adjusted to differ from the desired local oscillator frequency by a small amount such that the rectified current of the detector 38 will vary relatively rapidly with changes in oscillator frequency in either direction. A convenient adjustment is one in which the desired local oscillator frequency comes at a point on the transmission curve of resonator 88 at which the transmission is approximately 70% of maximum. Because the coupling between the amplifier tube 34 and the gas discharge tube 35 is designed for the amplification of intermittent short duration pulses such as are produced in the output of the discriminator circuit when the transmitter 3 is operaing at a suitable frequency, such pulses occurring commonly at a recurrence rate of 1000 or 2000 per second, it is desirable, in order that relatively slow variations of local oscillator frequency may result in changes of rectified current of the detector 38 which may be amplified by the tube 34 to produce a change in the voltage of the grid of the tube 35, to superimpose upon the frequency control of the local oscillator 20 recurrent short-time variations in frequency sufficiently small to have no important effect on the output of the receiver 10 and yet sufficiently large to make the output of the detector 38 a fluctuating voltage, having recurrent pulsations, rather than a relatively steady voltage. A method of producing such fluctuation in the frequency of the local oscillator 20 which has unusual advantages of convenience is provided by introducing a small amount of ripple from a condenser input rectifier into the circuit of the control electrode. The ripple method of providing such variation is particularly convenient where one or more of the power supplies used in connection with the system being controlled is operated with alternating current having a frequency of the order of 400 cycles.

In Fig. 2 the ripple voltage is obtained from the anode of the rectifier tube 80 through the coupling condenser 81. The rectifier tube 80 serves, in connection with the transformer 82 and the resistance capacitance filter including the resistances 83 and 84 and the capacitances 85 and 86, to provide the negative voltage for the cathode and grid of the gas discharge tubes 35 and 36. A similar effect might be produced with a rectifier ripple obtained from some other source, there being usually many possible sources of such ripple in a complete radio-echo detection system. Recurrent short-duration fluctuations may also be obtained from sources other than rectifier ripple, if desired.

In the circuit of Fig. 2, the condenser 81 may have a value of .001 $\mu f$, the condensers 85 and 86 may have respectively values of 2 and 0.5 $\mu f$ and the resistors 83 and 84 may have values of respectively 1000 and 2000 ohms. The voltage across the condenser 86 will exhibit relatively short-duration negative peak, one such peak corresponding with each half cycle of such polarity as to cause the tube 80 to conduct. In consequence the frequency of the local oscillator 20 will exhibit periodic short-duration changes to a slightly higher frequency and back again.

The natural frequency of the resonator 39 is accordingly made slightly lower than the desired local oscillator frequency (which in turn differs by the intermediate frequency of the system from the frequency of the fixed station to which it is desired to tune the receiver by means of the resonator 39). The periodic sudden changes to a slightly higher frequency and back again which results from the introduction of rectifier ripple through the condenser 81 will then result in periodic dips in the output of the rectifier 38. These dips may be regarded as negative pulses and they will result in the formation of recurrent positive voltage pulses on the grid of the tube 35 because of the well known inverting effect of a single stage of vacuum tube amplification. The peak intensity of such pulses will depend upon the relation of the local oscillator frequency to the natural frequency of the resonator 39.

The relation between the desired frequency of the local oscillator and the natural frequency of the resonator 39 is so organized that the former corresponds to a point sufficiently far down on the "skirt" of the resonance curve of the resonator so that a small increase in local oscillator frequency (i. e. a change away from resonance) will reduce the amplitude of the dips in the output of the detector 38 whereas a small decrease in local oscillator frequency will result in increased amplitude of such dip. Because dips of relatively small amplitude will fail to ignite the tube 35, an increase in local oscillator frequency will result in a gradual rise of the potential of the anode of the discharge tube 36 and consequently in a decrease of the local oscillator frequency, thus tending to correct the previous increase. Likewise a decrease in local oscillator frequency will result in more consistent firing of the gas tube 35 and consequent reduction of the potential of the anode of the tube 36, thus increasing and again correcting the local oscillator frequency.

In order that the resonator 39 may be relatively accurate as a frequency standard, it is preferably built with a relatively high Q and is also preferably provided with some temperature compensation. As shown in Fig. 2 the resonator 39 is of the coaxial type, having an outer cylindrical wall 88 and an inner cylindrical surface 89 mounted upon one of the end walls. The cylindrical member 89 has its free end at a location which is considerably short of the upper end of the cylindrical wall 88, so that a resonant coaxial conductor transmission line is provided having a short-circuited lower end and a substantially open-circuited upper end. The upper end of the cylinder 88 may be either open or closed, but it is usually convenient to close it, if only to prevent the introduction of too much dust or other foreign matter into the resonator. The cylindrical member 89 may conveniently be a silver plated invar tube, so that the length of the resonant transmission line of which the resonator is constituted will be substantially independent of temperature over a reasonable range of temperature variation. In order that the resonator 39 may be adjusted to have a suitable natural frequency for the previously described function of controlling the local oscillator 20, the upper extremity of the cylindrical member 89 is made to engage, preferably by spring contact obtained by the provision of suitable slots, a small plug 90 which may be made of silver plated invar. The plug 90 is adapted to slide axially within the end of the cylindrical member 89 and its position is controlled by a rod 91 and by a threaded plug 92 which engages threads provided on the inside of the cylindrical member 89. The threaded plug 92 may be provided with a slot or the like in order to permit adjustment of its position with a screw-driver. Once the adjustment of the natural frequency of the resonator 39 has been made, it may be preserved by sealing up the portion of the inside of the cylindrical member 89 which is not occupied by the structures 90, 91, 92 with wax, or by other means.

Coupling in and out of the resonator 39 is accomplished by means of small loops 93 and 94. These loops may be made quite small since the matter of resonator losses is relatively unimportant and a high loaded Q is desirable.

The circuit shown in Fig. 2 enables a relatively rapid change to be made from automatic control of the receiver tuning to the frequency of the transmitter 3 to automatic control of the receiver tuning to a predetermined fixed frequency, simply by throwing the switch 37.

Instead of the resonator 39, some other circuit of relatively high frequency-sensitivity could be used in a similar manner. Such a circuit might be constituted by a tuned amplifier. A resonator such as that shown in Fig. 2 is preferred because of its advantages of simplicity. For some very high frequencies commonly used for radio-echo detection, the resonator type of circuit, in one of its possible forms, may well be the only practical stable circuit of high frequency-sensitivity. In general what is desired for this purpose is a frequency-sensitive circuit, and the term "frequency-sensitive circuit" is used in the appended claims to include a resonator such as that of Fig. 2 and also to include such frequency-sensitive apparatus as sharply tuned amplifiers.

What I desire to secure and obtain by Letters Patent is:

1. In an apparatus for automatic control of the tuning of a radio receiver having a local oscillator adapted to be controlled in frequency by variations in a control voltage and having a control circuit adapted to produce saw-tooth variations in such voltage when said control circuit is not excited and adapted to produce suitable control variations of said voltage when said control circuit is excited, the combination which includes means for superimposing recurrent pulses upon said control variations of voltage, a frequency-sensitive circuit fed with energy by said local oscillator, a detector fed with oscillatory energy by said frequency-sensitive circuit, said frequency-sensitive circuit having a frequency response characteristic so related to the average frequency and the frequency variation characteristics of said local oscillator that a change in local oscillator frequency in the direction corresponding to the more gradual component of said saw-tooth variations will result in increased amplitude of recurrent pulse components in the output of said detector and so that a change in local oscillator frequency in a direction opposite to said direction will result in decreased amplitude of said recurrent pulse components, and means for coupling said recurrent pulse components of said detector to said control circuit adapted to excite said control circuit when the amplitude of said components exceeds a predetermined amplitude.

2. In an apparatus for automatic control of the tuning of a radio receiver having a local oscillator adapted to be controlled in frequency by variations in a control voltage and having a control circuit adapted to produce saw-tooth variations in such voltage and corresponding variations in the frequency of said local oscillator consisting of alternate gradual decreases and sudden increases of frequency when said control circuit is not excited and adapted to produce suitable control variations of said voltage when said control circuit is excited, the combination which includes means for superimposing recurrent pulses upon said control variations of voltage adapted to produce recurrent short duration variations, towards higher frequency and back, of the frequency of said local oscillator, a resonator fed with energy by said local oscillator, a detector coupled to said resonator, said resonator having a natural frequency so related to the average frequency and the frequency variation characteristics of said local oscillator that a decrease in local oscillator frequency will result in increased amplitude of recurrent pulse components in the output of said detector produced by said recurrent pulses and so that an increase in local oscillator frequency will result in decreased amplitude of said recurrent pulse components, and means for coupling said recurrent pulse components of said detector to said control circuit adapted to excite said control circuit when the amplitude of said component exceeds a predetermined amplitude.

3. In an apparatus for automatic control of the tuning of a radio receiver, the combination of means adapted to change receiver tuning in one direction including a filter circuit associated with detector means and adapted to operate in response to a locally transmitted signal of which it is desired to receive echoes and adapted to produce, upon the occurrence of such signal, an output which varies in magnitude when the frequency of said signal is varied, means adapted to change receiver tuning in the direction opposite to the aforesaid direction including a relaxation oscillator adapted to generate saw-tooth waves and having a reactive element adapted to change its energy level at a relatively slow rate in one direction while said first-mentioned means produces substantially no output and adapted to be maintained at a relatively constant energy level while said first-mentioned means produces a relatively large output which is less than its maximum output for said signal, and means associated with said first-mentioned means adapted to be connected in circuit in place of said filter circuit and including a resonant circuit tuned to a predetermined frequency and coupled to a detector and adapted to be excited by an oscillation generated in said receiver which determines the tuning of said receiver.

4. In an apparatus for automatic control of the tuning of a radio receiver, the combination of means adapted to change receiver tuning in one direction including a filter circuit associated with detector means and adapted to operate on a signal in response to a locally transmitted signal of which it is desired to receive echoes and adapted to produce, upon the occurrence of said signal, an output which varies in magnitude when the frequency of said signal varies, means adapted to change receiver tuning in the direction opposite to the aforesaid direction including a relaxation oscillator adapted to generate saw-tooth waves and having a reactive element adapted to change its energy level at a relatively slow rate in one direction while said first-mentioned means produces substantially no output and adapted to be maintained at a relatively constant energy level while said first-mentioned means produces a relatively large output which is less than its maximum output for said signal, means associated with said first-mentioned means adapted to be connected in circuit in place of said filter circuit and including a resonator tuned to a predetermined frequency adapted to be excited by an oscillation generated in said receiver which determines the tuning of said receiver, and a detector coupled to said resonator, and means for imposing a slight periodic variation of the said oscillation generated in said receiver adapted to cause the output of said detector to be periodically varied in amplitude, whereby said detector output is adapted for operating said first-mentioned means.

5. In an apparatus for automatic control of the tuning of a radio receiver having a local oscillator having a frequency-governing electrode, the combination of means adapted to raise said electrode voltage at an average rate determined by the frequency variation of a locally generated signal of which it is desired to receive echoes, said means including a filter circuit associated with detector means in such a manner that the amplitude of the output of such circuit for a given input amplitude of said signal varies in magnitude when the frequency of said signal is varied within a predetermined range, means including a relaxation oscillator adapted to raise said voltage gradually until limited by operation of said first-mentioned means when said means is operating and until limited by a relaxation oscillation when said first-mentioned means is quiescent, said relaxation oscillator including a condenser connected through a high resistance to a source of positive voltage which is also connected to said first-mentioned means through a part of said high resistance, said condenser having its terminal which is connected as aforesaid connected also to the said electrode of said local oscillator, means associated with said first-mentioned means adapted to be connected in circuit in place of said filter circuit and including a resonant circuit tuned to a predetermined frequency and adapted to be excited by said local oscillator and a detector coupled to said resonant circuit, and means for superimposing a ripple voltage upon the control voltages applied to said frequency-governing eletrode, whereby the output of said detector may be modulated and adapted to operate said first-mentioned means.

6. Apparatus for automatic control of the tuning of a radio receiver having a local oscillator having a frequency-governing electrode, including a resonant circuit tuned to a predetermined frequency and coupled to the output of said local oscillator, a detector coupled to said resonant circuit, means including a first gas discharge tube, a second gas discharge tube and a condenser one terminal of which is grounded and the other terminal of which is connected to said frequency-governing electrode and also to the anode of a said first gas discharge tube, said means including also a second condenser connected to the ungrounded side of said first-mentioned condenser through a high resistance and connected also to a source of positive voltage through a high resistance and connected also directly to the anode of said second gas discharge tube which tube is adapted to be ignited when the output of said detector reaches a predetermined level, said second condenser being of relatively small capacitance compared to said first-mentioned condenser and being adapted to be discharged upon ignition of said second gas discharge tube, and by repeated discharging to decrease the rate of dissipation of a negative charge of said first condenser and thereby to control the frequency of said local oscillator, said second gas discharge tube having a control grid, means connecting the output of said detector to said control grid of said second gas discharge tube, means for superimposing upon the voltage of said frequency-governing electrode a ripple voltage adapted to cause periodic pulses in the output of said detector and thereby to adapt said detector output to repeatedly operate said second gas discharge tube by means of said grid when said output reaches said predetermined amplitude, said predetermined frequency being such that variations in local oscillator frequency resulting from said ripple voltage will produce pulses in the output of said detector having a polarity adapted to produce positive pulses on the said grid of said second discharge tube and also such that approach of said local oscillator frequency to said predetermined frequency will increase the amplitude of said pulses in the output of said detector.

7. In a high frequency apparatus having means for transmitting high intensity high frequency electromagnetic energy and means for receiving relatively low-intensity electromagnetic energy reflected from a distant object, the combination comprising a high frequency oscillator having a frequency-controlling element, a first mixer responsive to low-intensity signals and subject to saturation in response to high-intensity signals coupled to said receiving means and said oscillator for deriving a heterodyne signal for producing indications of said object, a second mixer coupled to said oscillator, attenuating means coupling said second mixer and said transmitting means for applying an attenuated portion of said high-intensity energy to said second mixer whereby said second mixer produces a frequency-controlling heterodyne signal whose frequency is dependent upon the frequencies of said high-intensity high-frequency energy and said oscillator, and means responsive to said frequency-controlling signal and connected to said frequency-controlling element to vary the frequency of said oscillator in accordance with said frequency-controlling signal to suppress variations of the latter from a desired frequency.

8. High frequency apparatus comprising a transmitting channel for high-intensity electromagnetic energy, a receiving channel for receiving relatively low-intensity electromagnetic energy reflected from a distant object, a high frequency oscillator having a frequency-controlling element, a first mixer responsive to low-intensity signals and subject to saturation in response to high-intensity signals coupled to said receiving channel and said oscillator for deriving a first beat signal of frequency equal to the difference between the frequencies of the received energy and said oscillator, utilization apparatus connected in said receiving channel for transforming said beat signal into indications of said object, a second mixer loosely coupled to said transmitting channel and said oscillator whereby said mixer produces a second beat signal whose frequency is dependent upon the frequencies of said high-intensity high-frequency energy and said oscillator, and frequency-responsive means connected to said second mixer and having an output circuit coupled to said frequency-controlling element to vary the frequency of said oscillator in accordance with said second beat signal to suppress variations of said second beat signal frequency from a desired frequency.

9. In a circuit including an oscillator, the frequency of said oscillator being controlled by the potential on a frequency governing electrode, means for alternately and selectively exercising one of two controls over the frequency of said oscillator, said first control maintaining the frequency of said oscillator at a substantially constant predetermined frequency, said second control maintaining the frequency of said oscillator in a fixed frequency relationship to a generated signal, said means comprising, a first capacitor having one terminal thereof connected to a point of first potential and a second terminal thereof connected to a point of second potential different from said first potential through a first resistor, a first switch means connected in shunt with said first capacitor, said first switch means being responsive to signals which exceed a predetermined value to discharge said first capacitor, a second capacitor having a first terminal thereof connected to a point of third potential and a second terminal thereof connected to a point of fourth potential different from said third potential through a second resistor, a third resistor connecting said second terminal of said first capacitor to said second terminal of said second capacitor, means coupling said second terminal of said capacitor to said frequency governing electrode of said oscillator, means coupled to said oscillator for producing rapid, small amplitude variations in the frequency of said oscillator, a cavity resonator coupled to the output of said oscillator, said resonator being tuned to a frequency such that said predetermined frequency is within the transmission band of said resonator and displaced from the resonant frequency of said resonator, a detector coupled to the output of said resonator, a two-position switch means, said two-position switch means when in a first position coupling the output of said detector to said first switch means to control the operation thereof, a mixer coupled at first and second inputs thereof to said local oscillator and to the source of said generated signal, and a discriminator coupled to the output of said mixer, said two-position switch means when in said second position coupling the output of said discriminator to said first switch means to control the operation thereof.

10. In a circuit including an oscillator, the frequency of said oscillator being controlled by the potential on a frequency governing electrode, means for alternatively and selectively exercising one of two controls over the frequency of said oscillator, said first control maintaining the frequency of said oscillator at a substantially constant predetermined frequency, said second control maintaining the frequency of said oscillator in a fixed frequency relationship to a generated signal, said means comprising, means coupled to said oscillator for producing rapid, small amplitude variations in the frequency of said oscillator, a cavity resonator coupled to the output of said oscillator, said resonator being tuned to a frequency such that said predetermined frequency is within the transmission band of said resonator and displaced from the resonant frequency thereof, a detector coupled to the output of said resonator, a mixer coupled at first and second inputs thereof to said oscillator and to the source of said generated signals, a frequency discriminator coupled to the output of said mixer, a first control circuit coupled to said frequency governing electrode and adapted to cause the frequency of said oscillator to sweep periodically through a predetermined range of frequencies, a second control circuit associated with said first control circuit and adapted to be made operative by a signal exceeding a predetermined amplitude, said second control circuit when operative effectively reversing the direction of said frequency sweep and a two-position switch means, said switch means when in a first position coupling the output of said detector to said second control circuit, said switch when in a second position coupling the output of said discriminator to said second control circuit.

11. In a high frequency apparatus having means for transmitting high intensity, high frequency electromagnetic energy and means for receiving relatively low intensity electromagnetic energy reflected from a distant object, the combination comprising a high frequency oscillator having a frequency controlling electrode, and means for alternatively and selectively exercising one of two controls over the frequency of said oscillator, said first control maintaining the frequency of said oscillator at a substantially constant predetermined frequency, said second control maintaining the frequency of said oscillator in a fixed frequency relationship to said high intensity, high frequency electromagnetic energy, said means for exercising said two controls comprising, a mixer coupled to said oscillator, attenuating means coupling said mixer to said transmitting means for applying an attenuated portion of said high-intensity energy to said mixer whereby said mixer produces a frequency-controlling heterodyne signal whose frequency is dependent upon the frequencies of said high-intensity, high-frequency energy and said oscillator, a frequency discriminator coupled to the output of said mixer, means coupled to said oscillator for producing rapid, small amplitude variations in the frequency of said oscillator, a cavity resonator coupled to the output of said oscillator, said resonator being tuned to a frequency such that said predetermined frequency is within the transmission band of said resonator and displaced from the resonant frequency thereof, a detector coupled to the output of said resonator, a first control circuit coupled to said frequency controlling electrode and adapted to cause the frequency of said oscillator to sweep periodically through a predetermined range of frequencies, a second control circuit adapted to be made operative by a signal exceeding a predetermined amplitude, said second control circuit when operative effectively reversing the direction of said frequency sweep, and a two-position switch means, said switch means when in a first position coupling the output of said detector to said second control circuit, said switch means when in a second position coupling the output of said discriminator to said second control circuit.

12. In a high frequency apparatus having means for transmitting high-intensity, high-frequency electromagnetic energy and means for receiving relatively low intensity electromagnetic energy reflected from a distant object, the combination comprising a high frequency oscillator having a frequency controlling electrode and means for alternatively and selectively exercising one of two controls over the frequency of said oscillator, said control means comprising a mixer coupled to said oscillator, attenuating means coupling said mixer to said transmitting means for applying an attenuated portion of said high intensity energy to said mixer, a frequency discriminator coupled to the output of said mixer, a cavity resonator coupled to the output of said oscillator, said resonator being tuned to a frequency such that said predetermined frequency is within the transmission band of said resonator and displaced from the resonant frequency thereof, a detector coupled to the output of said resonator, a first control circuit coupled to said frequency controlling electrode and adapted to cause the frequency of said oscillator to sweep periodically through a predetermined range of frequencies, a second control circuit adapted to be made operative by a signal exceeding a predetermined amplitude, said second control circuit when operative effectively reversing the direction of said frequency sweep, and a two-position switch means, said switch means when in a first position coupling the output of said detector to said second control circuit to exercise one of said two controls, said switch means when in a second position coupling the output of said discriminator to said second control circuit to exercise the other of said two controls.

PERSA R. BELL, Jr.

REFERENCES CITED

The following references are of record in the file of this patent:

UNITED STATES PATENTS

| Number | Name | Date |
|---|---|---|
| 2,250,532 | Hansell | July 29, 1941 |
| 2,261,800 | Freeman | Nov. 4, 1941 |
| 2,283,523 | White | May 19, 1942 |
| 2,284,266 | Bellescize | May 26, 1942 |
| 2,295,629 | Bond | Sept. 15, 1942 |
| 2,304,377 | Roberts | Dec. 8, 1942 |
| 2,334,189 | Goldstine | Nov. 16, 1943 |
| 2,404,568 | Dow | July 23, 1946 |
| 2,410,075 | Hutchins et al. | Oct. 29, 1946 |
| 2,421,020 | Earp | May 27, 1947 |
| 2,424,796 | Carlson | July 29, 1947 |
| 2,434,293 | Stearns | Jan. 13, 1948 |
| 2,434,294 | Ginzton | Jan. 13, 1948 |
| 2,462,857 | Ginzton et al. | Mar. 1, 1949 |

FOREIGN PATENTS

| Number | Country | Date |
|---|---|---|
| 110,781 | Australia | June 7, 1940 |
| 445,350 | Great Britain | Apr. 6, 1936 |

OTHER REFERENCES

"Automatic Frequency Control," Wireless World, June 8, 1939, vol. 44, No. 23, page 545.